United States Patent
Kusunoki

(10) Patent No.: US 6,766,151 B2
(45) Date of Patent: Jul. 20, 2004

(54) DISTORTION-COMPENSATING APPARATUS

(75) Inventor: Shigeo Kusunoki, Tokyo (JP)

(73) Assignee: Sony Corporation, Tokyo (JP)

( * ) Notice: Subject to any disclaimer, the term of this patent is extended or adjusted under 35 U.S.C. 154(b) by 614 days.

(21) Appl. No.: 09/846,651

(22) Filed: May 1, 2001

(65) Prior Publication Data

US 2002/0009979 A1 Jan. 24, 2002

(30) Foreign Application Priority Data

May 1, 2000 (JP) .................................... P2000-132488

(51) Int. Cl.[7] ............................................... H04B 1/04
(52) U.S. Cl. ..................... 455/114.3; 375/296; 330/149
(58) Field of Search .......................... 455/127.1, 127.2, 455/114.2, 114.3; 375/296, 297; 330/149, 136, 107

(56) References Cited

U.S. PATENT DOCUMENTS 5,121,077 A * 6/1992 McGann ..................... 330/149
5,124,665 A * 6/1992 McGann ..................... 330/149
5,404,378 A * 4/1995 Kimura ..................... 375/296
5,598,127 A * 1/1997 Abbiati et al. ............. 330/149

* cited by examiner

Primary Examiner—Nguyen T. Vo
Assistant Examiner—Nhan T. Le
(74) Attorney, Agent, or Firm—Jay H. Maioli

(57) ABSTRACT

To provide a distortion-compensating apparatus capable of stably determining update values when distortion-compensating data to be stored in an amplitude(gain)-compensation-data memory is updated corresponding to ambient temperatures in a distortion-compensating apparatus of an RF-power amplifying means. When updating adverse distortion data for an RF-power amplifying means 12 in a portable telephone or the like corresponding to ambient temperatures, envelope detection signals at input and output sides of the power amplifying means 12, the distortion-compensating apparatus digitizes the individual envelope signals, performs arithmetic operations to obtain the amount of a deviation from a linear gain by using arithmetic-operation means 20 and 21, and thereby updates adverse distortion data to be stored in amplitude-compensation-data memory 7, 7a, 7b.

3 Claims, 9 Drawing Sheets

DISTORTION-COMPENSATING APPARATUS

BACKGROUND OF THE INVENTION

1. Field of the Invention

The present invention relates to a distortion-compensating apparatus; particularly, the invention relates to a distortion-compensating apparatus useable for a transmission-use RF-power amplifying circuit used in a portable telephone.

2. Description of the Related Art

Recently, communication has been performed for an increasing amount of data at an increasing speed, and corresponding linearities are strictly required of transmission-power amplifying circuits in digital radio communication apparatuses. On the other hand, however, problems arise in that the strict linearity requirements impair the improvement in power efficiency of power amplifying circuits.

Time for continuous communication using a digital portable telephone already enjoying wide use in the market is increasing. For a new digital radio communication apparatus to hit the market, in view of competitive power of the product, use time thereof cannot be ignored. Recently, there is a growing tendency that a new distortion-compensation technology is employed for the apparatus to improve the efficiency in communication.

The employment of the technology, however, entails voluminousness in terms of the size of the circuit, so that the technology can not be put to use in portable telephones having an advantage of being small sized and light in weight. In addition, since the portable telephones are characterized in that they are used in variable environments, the distortion compensation needs to be adaptable to the environmental variation. The adaptability coupled with miniaturization becomes a very important problem. As a distortion compensation apparatus of this kind, there is known a predistortion technology that is provided with compensation means having a reverse characteristic to the distortion of the power ampifier circuit.

There are a number of reports regarding the aforementioned predistortion technology, including reports on such as the adaptation of predistortion as well as feedforward and the like. Hereinbelow, a description will be made regarding a couple of conventional examples in the field of the adaptive distortion compensation apparatuses used for the aforementioned predistortion.

As a first conventional configuration, description refers to a report on "Power ampifyingAdaptive Linearization Using Predistortion with Polynomial", 1992-European Microwave Conference, Vol. 22, pp.1125–1130. FIG. 11 shows a block diagram of the example introduced in the document.

In FIG. 11, Vout=A(Vin) represents a nonlinear-type output characteristic of a power amplifying circuit 12 for which distortion compensation must be performed. A linearization comparator circuit 50 performs arithmetic operations of in-phase and orthogonal signals I and Q by using a function H (I, Q) that linearizes A (Vin). As a result of the arithmetic operations, the signals I and Q are fed to a digital-to-analog converter circuit (DAC) 51, are converted to analog signals, and are concurrently converted to radio-frequency(RF)-band signals. The converted signals are then input to the power amplifying circuit 12. An output Vout therefrom is detected and is converted by a demodulator circuit 52 to thereby produce base-band converted signals If and Qf. As adaptive compensation relative to variations in temperature, the linearization comparator circuit 50 performs comparison between the signals I and Q and the detection signals If and Qf; and the constants included in the linearization constant H are adjusted so that the difference between the signals becomes zero. The above-described operations are repeated until the difference precisely becomes zero, thereby finally determining the constants included in the constant H (I and Q) to be optimal values.

Another conventional configuration is described in the document "Adaptive Linearization Using Predistortion", IEEE Transaction on Vehicalar Technologies, Vol. 43, No. 2, May 1994, pp. 323–332. FIG. 12 is a block diagram shown in the above-referenced document. In FIG. 12, the same reference numerals and symbols as those in FIG. 11 are used for corresponding portions for the convenience of description. In response to input signals I and Q, a conversion table 55 in a memory or the like is accessed to perform data conversion. As a result, data I' and Q' that can be used to linearize a power amplifying circuit 12 are obtained, and are input to a power amplifying circuit 12. An output Vout therefrom is detected and is converted by a demodulator circuit 52 to produce base band converted signals If and Qf. As adaptive compensation relative to variations in temperature, the circuit comprises an address generator section 54. The address generator section 54 performs comparison between the signals I and Q and the detection signal If and Qf and to adjust an address for accessing the conversion table 55 so that a difference en between the signals becomes zero. The address generator section 54 is repeatedly adjusted until the difference en precisely becomes zero to finally optimize the value of the address used to access the conversion table 55.

In the above-described conventional configurations, optimization is performed for either the constants included in the linearization function or the address used to access the linearization table. In either of the examples, a feedback loop is used to repeat the required operations and to thereby reduce the intersignal difference. However, the feedback loop has serious problems in that it includes characteristics of the power amplifying circuit 12, and there is no way of ensuring that optimal values are stably obtained at all times.

The present invention is implemented to solve the above-described problems. An object of the invention is to solve the problems by detecting input/output in a power amplifying circuit, thereby detecting deviation from a linear gain, and performing distortion adaptive compensation relative to variations in temperature. The present invention can easily provide a distortion-compensating apparatus that solves the conventionally caused problems in which optimal values cannot be obtained.

SUMMARY OF THE INVENTION

According the present invention, a distortion-compensating apparatus for detecting envelope signals of an RF (radio frequency) input signal generating envelope variations to thereby perform predistortion for controlling amplitude characteristics of power amplifying means for which distortion compensation is to be performed is characterized in that envelope signals at an input side and an output side of the aforementioned power amplifying means are individually subjected to arithmetic operations, the amount of deviation from a linear gain is thereby obtained, and distortion-compensating data in a storing means which prestores compensation values for amplitude compensation is updated to data obtained from the arithmetic operations so as to be adaptive to temperature variations in the aforementioned power amplifying means.

DESCRIPTION OF THE PREFERRED EMBODIMENTS

Figure 1:
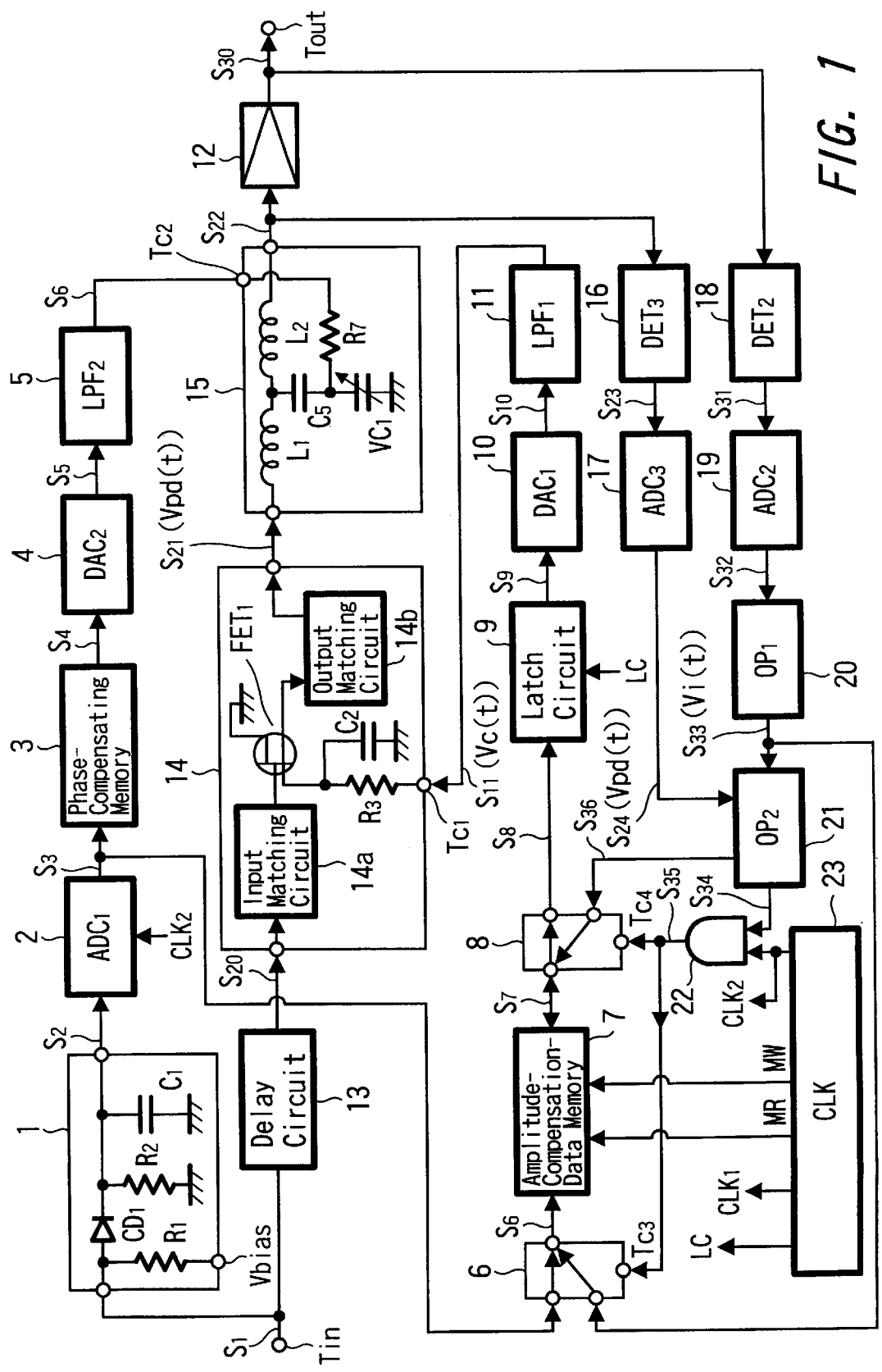
FIG. 1 is a block diagram showing an example mode of a distortion-compensating apparatus according to the present invention according to the present invention.

Hereinbelow, referring to the accompanying drawings, a description will be made regarding a distortion-compensating apparatus of the present invention for a transmission-use RF power amplifying circuit (which hereinbelow will be referred to as a "power amplifying circuit"). FIG. 1 is a block diagram of an embodiment of a distortion-compensating apparatus according to the present invention. First, using FIG. 1, the overall circuit configuration will be described.

FIG. 1 shows a configuration consisting chiefly of four routes. They are a main route that includes a power amplifying circuit 12 for which distortion compensation is performed; a gain (amplitude) controller route for controlling a gain variable circuit 14 and a phase shift circuit 15 that are provided on the main route; a phase-shift controller route for controlling phase shift; and a route for performing switching-control of multiplexers 6 and 8 provided on the gain controller route.

The main route of the present invention is configured to include a delay circuit 13, the gain variable circuit 14, and the phase shift circuit 15. The delay circuit 13 receives a variable-envelope RF input signal $S_1$ input through an input terminal $T_{in}$, delays pass-through time thereof to adjust timing with which the RF input signal $S_1$ passes through a phase-shift compensation controller route and an amplitude compensation controller route, and outputs a signal $S_{20}$. The gain variable circuit 14 receives the signal $S_{20}$ output from the delay circuit 13, receives an output $S_{11}$ of a first low-bandpass filter circuit 11 ($LPF_1$) to a control terminal $Tc_1$, and varies a pass-through gain according to a signal voltage applied therein. The phase shift circuit 15 receives an output signal $S_{21}$ of the gain variable circuit 14, receives a signal $S_6$ output from a second $LPF_2$·5 to a control terminal $Tc_2$, varies a passing phase according to a signal applied therein, and outputs an output signal $S_{22}$ thereof to the power amplifying circuit 12.

The gain controller route is configured to include a first envelope detection circuit 1 ($DET_1$), an analog-to-digital converter circuit 2 ($ADC_1$), a first multiplexer 6, a first amplitude-compensation-data memory 7, a second multiplexer 8, a latch circuit 9, a first digital-to-analog converter circuit 10 ($DAC_1$), and the first low-bandpass filter circuit 11 ($LPF_1$). The $DET_1$ 1 receives part of the variable-envelope input RF signal $S_1$ to the input terminal $T_{in}$ and detects an envelope signal $S_2$. The analog-to-digital converter circuit 2 digitizes the envelope signal $S_2$ in synchronization with a clock signal $CLK_2$ and outputs a digital signal $S_3$. The first multiplexer 6 receives the digital signal $S_3$ as a first address, uses an AND-gate control signal $S_{35}$ to thereby switch a second address added to another input, and outputs the second address. The first amplitude-compensation-data memory 7 outputs an amplitude compensation data $S_7$. The amplitude compensation data $S_7$ functions as adverse-distortion-compensating data prestored for compensating amplitude by using the output of the first multiplexer 6 as an address and that corresponds to the aforementioned address. The second multiplexer 8 has a first and second states. In the first state, the AND-gate control signal $S_{35}$ is used to input the amplitude compensation data $S_7$ as a first input and to produce an output as a signal $S_8$. In the second state thereof, arithmetic-operation data $S_{36}$ of a second arithmetic-operation section 21 is used as a second input, and is written as data in the amplitude-compensation-data memory 7. The latch circuit 9 latches the signal $S_8$ in synchronization with a latch signal LC. The ($DAC_1$) 10 converts an output signal $S_9$ of the latch circuit 9 to an analog signal $S_{10}$. The first low-bandpass filter circuit 11 ($LPF_1$) removes digital noise therefrom in the analog signal $S_{10}$, and outputs a signal $S_{11}$ output therefrom to the gain variable circuit 14.

The phase-shift controller route, which is a third major route, is configured to include a second phase-compensating memory 3, a second $DAC_2$ 4, and a second $LPF_2$ 5. When the digital signal $S_3$ is used as an address, the second phase-compensating memory 3 outputs a phase compensation data $S_4$ that is to be prestored for compensating phase shift and that corresponds to the aforementioned address. The $DAC_2$ converts the phase compensation signal $S_4$ to an analog signal $S_5$. The second $LPF_2$ 5 removes digital noise therefrom in the analog signal $S_5$, and outputs an output control signal $S_6$ to the control terminal $Tc_2$ of the phase shift circuit 15.

The route for performing switching-control of the first and second multiplexers 6 and 8 is configured to include a second envelope detection circuit 18 ($DET_2$), a second digital-to-analog converter circuit 19 ($ADC_2$), a first arithmetic-operation section 20, a second arithmetic-operation section 21, an AND-gate circuit 22, a third envelope detection section 16 ($DET_3$), and a third $DAC_3$ 17. The $DET_2$ 18 detects an envelope signal $S_{31}$ in an output $S_{30}$ of the power amplifying circuit 12 for which distortion compensation must be performed. The second $ADC_2$ 19 digitizes the envelope signal $S_{31}$, and outputs a digital signal $S_{32}$.

When "gv" represents a linear gain of the analog-to-digital converter circuit 2 for which distortion compensation must be performed, the first arithmetic-operation section 20 performs a first arithmetic operation of multiplying the signal $S_{32}$ by (1/gv). Then, it outputs a result $S_{33}$ of the first arithmetic operation, which is used as a second input and a second address of the first multiplexer 6. The second arithmetic-operation section 21 performs a second arithmetic operation by using a signal $S_{24}$ for the result $S_{33}$ of the first arithmetic operation. Then, it outputs arithmetic-operation data $S_{36}$ as a result of a second arithmetic-operation result, as a second input of the second multiplexer 8; and upon completion of the second arithmetic operation 21, it performs notification of the completion via a signal $S_{34}$. The AND-gate circuit 22 obtains a logical sum of a signal $S_{34}$ and a clock signal $CLK_2$ output from a clock circuit 23, and outputs the AND-gate control signal $S_{35}$ to respective control terminals $TC_3$ and $TC_4$ of the first and second multiplexers 6 and 8. The $DET_3$ 16 detects an envelope signal $S_{23}$ in a front stage of the power amplifying circuit 12. The third $DAC_3$ 17 digitizes the envelope signal $S_{23}$, and outputs a signal $S_{24}$.

In addition, the aforementioned route comprises the clock circuit 23 that outputs a signal MR used for reading data from the first amplitude-compensation-data memory 7, a signal MW used for writing data to the first amplitude-compensation-data memory 7, the latch signal LC, and clock signals $CLK_1$ and $CLK_2$.

Hereinbelow, a description will be made regarding operation of the distortion-compensating apparatus according to the present invention. As shown in FIG. 1, the distortion-compensating apparatus is comprised of the three signal routes (which are the main route including the power amplifying circuit 12 for which distortion compensation is performed, the amplitude controller route, and the phase compensation circuit) and the loop for performing switching-control of the multiplexers provided on the amplitude controller route.

In FIG. 1, the input terminal $T_{in}$ of the distortion-compensating apparatus is fed with an RF input signal $S_1$, which is used as a portable-telephone-used quadrature phase modulation signal, such as a band-limited π/4-shift QPSK (quadrature phase shift keying) signal or a zero-degree QPSK signal. The variable-envelope RF input signal $S_1$ includes an envelope component for modulating an RF transmission wave by using a baseband signal component and for slowly varying it.

The variable-envelope RF input signal $S_1$, which is fed to the input terminal $T_{in}$, is divided into two, and the divided signals are input to the main route and the amplitude/phase-shift compensation route of the main power amplifying circuit 12. The variable-envelope RF input signal $S_1$ input to the compensation route is used in the envelope detection circuit 1 to detect an envelope signal $S_2$ thereof.

The envelope signal $S_2$ detected in the first envelope detection circuit 1 is converted by the $ADC_1$ 2 to digital data. Data $S_3$ of the digitized envelope signal is divided into two so as to be input to the amplitude compensation route and the phase compensation route. With a signal $S_6$ being used as an address, data $S_3$ input to the amplitude compensation route is fed to the first amplitude-compensation-data memory 7 via a first switching route in the first multiplexer 6. The first amplitude-compensation-data memory 7 is prestored with adverse-distortion-compensating data used for amplitude compensation, and amplitude compensation data $S_7$ corresponding to an address $S_6$ is fed to the latch circuit 9 as an output signal $S_8$ via the second multiplexer 8.

According to the latch signal LC output from the clock circuit 23, the latch circuit 9 latches the output signal $S_8$ output from the second multiplexer 8, and retains it.

Signal $S_9$ is latched by the latch circuit 9, is converted by the first $DAC_1$ 10 to an analog signal $S_{10}$, and passes through the first $LPF_1$ 11. After noise is removed therefrom, the analog signal $S_{10}$ is input as a control signal $S_{11}$, to the control terminal $Tc_1$ of the gain variable circuit 14 to thereby control pass-through gain (amplitude) of the gain variable circuit 14. In the above description, either the multiplexer 6 or 8 is assumed to have a first switched state, and the first amplitude-compensation-data memory 7 is assumed to be in a first read state.

Figure 3:
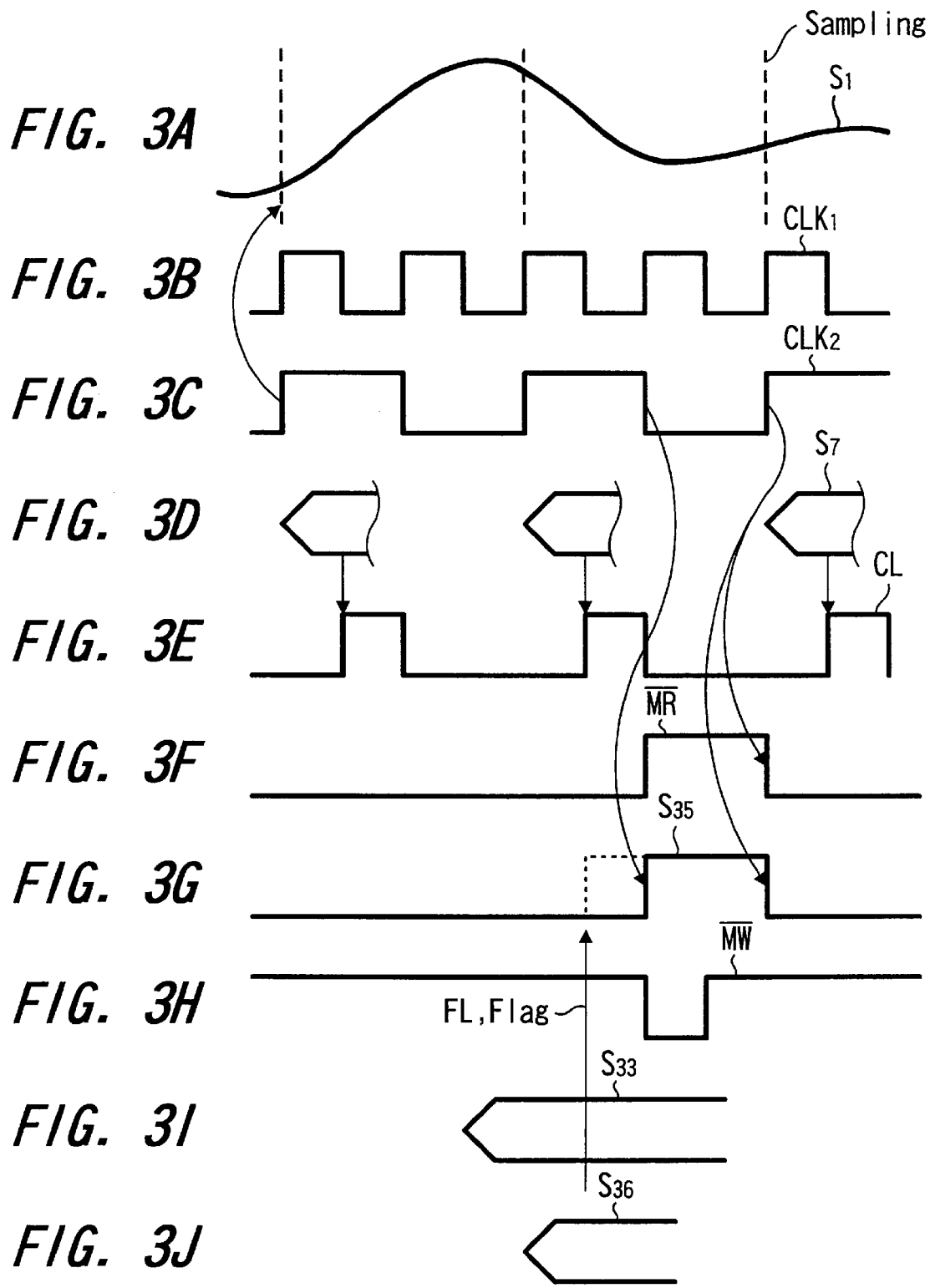
FIG. 3 shows time charts regarding the distortion-compensating apparatus.

Hereinbelow, a description will be made regarding the above-described timing using timing charts in FIG. 3. FIG. 3(A) shows the RF input signal $S_1$ that is fed to the input terminal $T_{in}$ and that includes a variation in envelope, in which sampling is performed at a sampling point indicated by a dotted line.

FIG. 3(B) shows the clock signal $CKL_1$ output from the clock circuit 23. FIG. 3(C) shows a clock signal $CLK_2$ that is a result of ½-division of the clock signal $CKL_1$ and that is output from the clock circuit 23. As shown in FIG. 3(A), the RF input signal $S_1$ is sampled at a rising section of a clock signal $CLK_2$ to thereby generate digital signal $S_3$ obtained through the digital conversion performed by the $ADC_1$ 2.

When the digital signal $S_3$ output from the $ADC_1$ 2 is fed as an address of the first amplitude-compensation-data memory 7 via the first multiplexer 6 in the first state, the data $S_7$ for which amplitude compensation has been performed is output from the first amplitude-compensation-data memory 7, as shown in FIG. 3(D).

Amplitude compensation data $S_7$ is modified to a signal $S_8$ through the second multiplexer 8, and is sampled at a rising stage of the latch signal LC. Then, as shown in FIG. 7(E), the signal $S_7$ is latched in the latch circuit 9. Timing of the latch circuit 9 is selected according to a logical sum of the reference clock signal $CKL_1$ and a half cycle from a fall stage of the ½-divided clock signal $CKL_2$. In the present mode, in a normal state, in synchronization with rising of the ½-divided clock signal $CKL_2$, data is read from the first amplitude-compensation-data memory 7, and latching thereof in the latch circuit 9 and control thereof to the gain variable circuit 14 are repeated.

The digital signal $S_3$ fed into the phase compensation route accesses the second phase-compensating memory 3 having the same configuration as that of the amplitude compensation route, and controls the second phase-compensating memory 3 to output the adverse-distortion phase compensation data $S_4$ prestored in the second phase-compensating memory 3. Phase compensation data $S_4$ is converted by the second $DAC_2$ 4 into an analog signal $S_5$. The analog signal $S_5$ passes through the second $LPF_2$ 5, and is input as a signal $S_6$ to the control terminal $Tc_2$ of the phase shift circuit 15.

The other one of the RF input signal $S_1$ is input to the main route, passes through the delay circuit 13, and is converted to a delayed signal $S_{20}$. The signal $S_{20}$ is input to the gain variable circuit 14, is subjected to amplitude compensation, and is converted to a signal $S_{21}$. Thereafter, the signal $S_{21}$ is input to the phase shift circuit 15, subjected to phase compensation, is converted to a signal $S_{22}$, and is input to the power amplifying circuit 12 for which distortion compensation must be performed. An envelope signal of a signal proceeding along the phase compensation route and an envelope signal proceeding along the amplitude compensation route need to be the same regarding timing as an envelope signal of the main route that proceeds to the gain variable circuit 14 and the phase shift circuit 15. The delay circuit 13 functions to make the timing to be the same.

Hereinbelow, the above-described first amplitude-compensation-data memory 7 will be described in more detail. First, an RF input signal voltage V is expressed by the following expressions, wherein an envelope voltage of the RF input signal voltage is represented by Vi(t), and an angular frequency of the RF signal is represented by ω:

$$V = Vi(t) \cdot \cos(\omega t) \qquad (1)$$

When an envelope voltage of the output $S_{21}$ of the gain variable circuit 14 is represented by Vpd(t), and voltage of the control signal $S_{11}$ applied to the control terminal $Tc_1$ of the gain variable circuit 14 is represented by Vc(t), the voltage to be stored in the first amplitude-compensation-data memory 7 is Vc(t).

Accordingly, when a conversion coefficient is represented by "a", and a gain G(Vc) of the gain variable circuit 14 is expressed by $$G(Vc) = 1 + a \cdot Vc(t) \qquad (2),$$

$$Vpd(t) = Vi(t) \cdot G(vc) \qquad (3).$$

When the expression (3) is assigned to the expression (2), $$Vpd(t) = Vi(t) \cdot (1 + a \cdot Vc(t)).$$

From this, $$Vc(t) = (1/a) \cdot (Vpd(t)/Vi(t) - 1) \qquad (4)$$

can be obtained.

Figure 4:
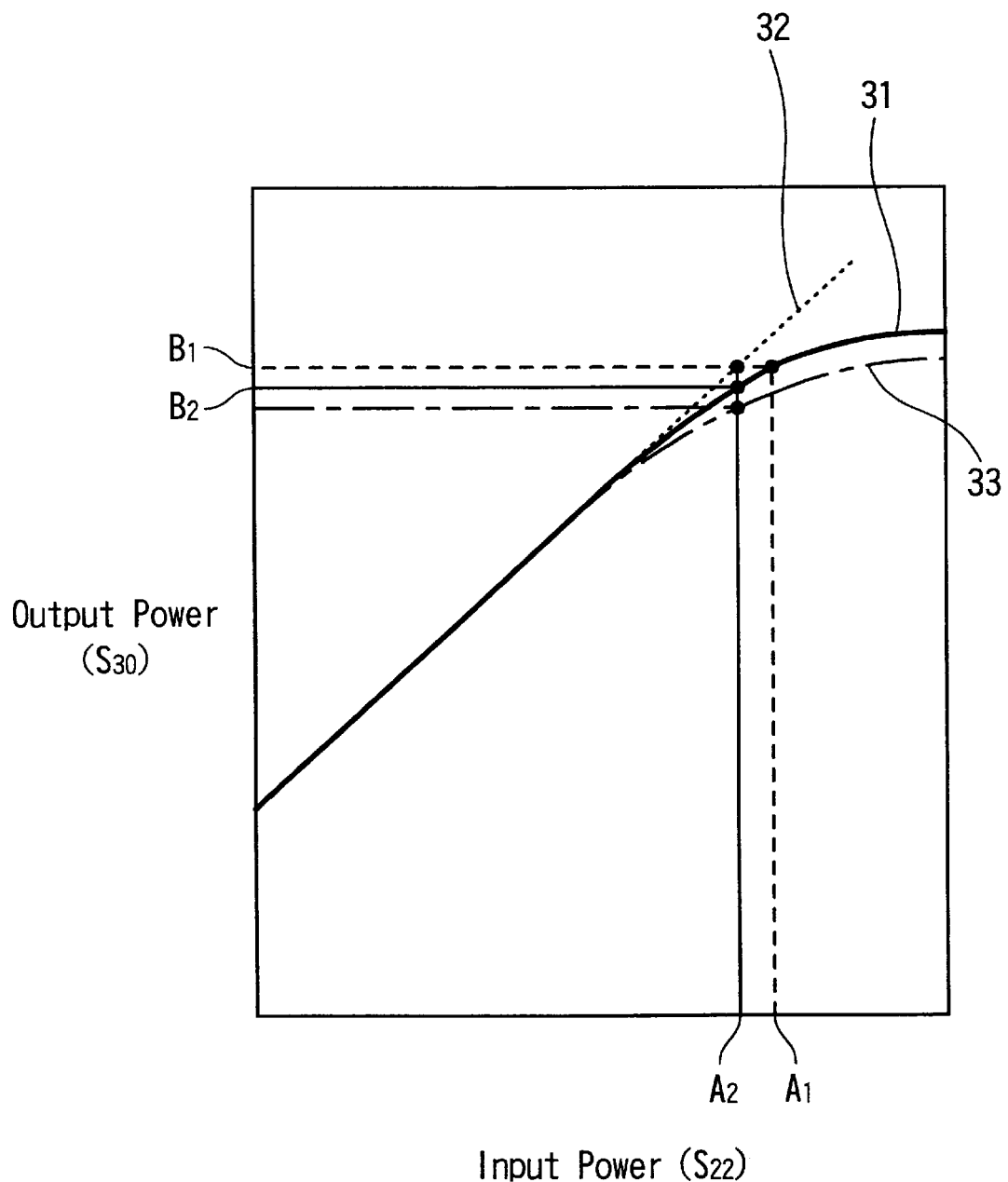
FIG. 4 is an amplitude/amplitude (AM/AM) characteristic diagram of a power amplifying circuit used in the distortion-compensating apparatus of the present invention.

For the power amplifying circuit 12 for which distortion compensation must be performed, the envelope voltage Vpd(t) can be obtained by measurement of input/output characteristics, as shown in FIG. 4. Therefore, the envelope voltage Vpd(t) may be used to operate the aforementioned expression (4) and to prestore the result of the operation in the first amplitude-compensation-data memory 7.

Figure 5:
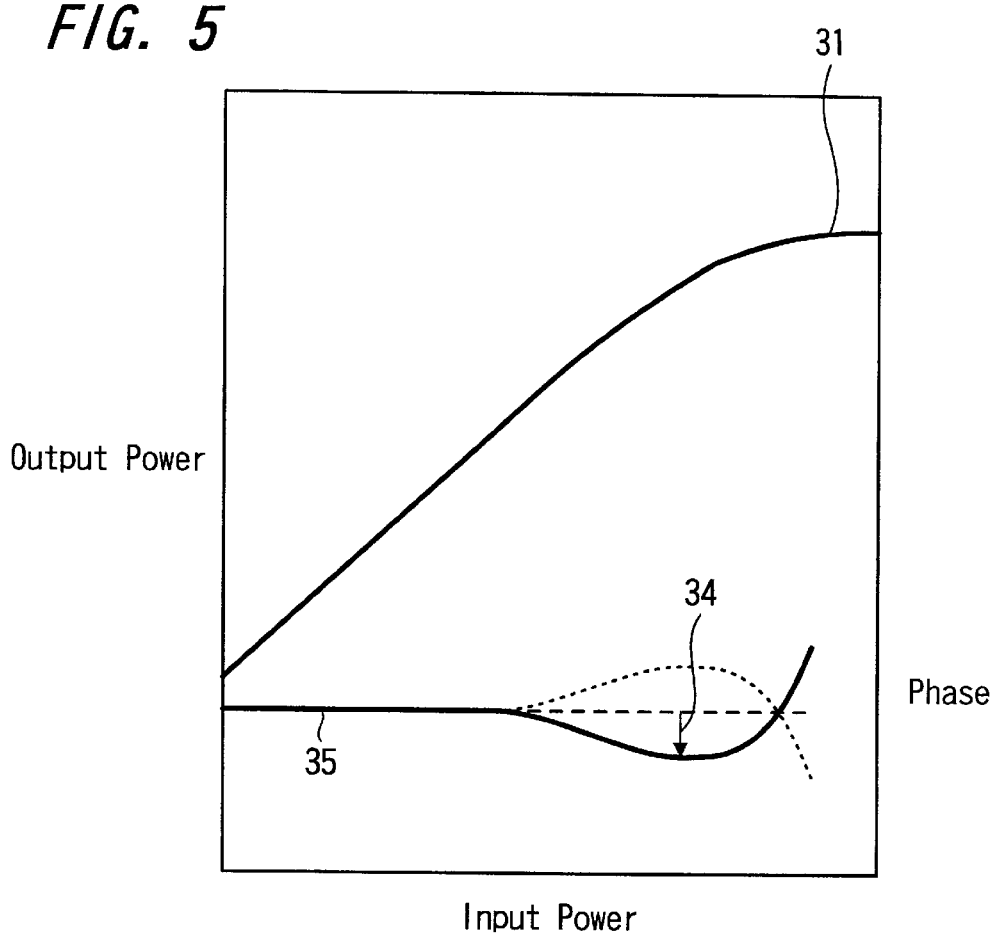
FIG. 5 is an amplitude/amplitude (AM/AM), amplitude/phase (AM/PM) characteristic diagram of the power amplifying circuit used in the distortion-compensating apparatus of the present invention.

In addition, compared to the amplitude compensation data, the phase compensation data to be stored in the second phase-compensating memory 3 is very simple. Amplitude/phase (AM/PM) characteristics 35, as shown in FIG. 5, of the power amplifying circuit 12 are obtained by measurement, and a value having an adverse sign of that of a value of a phase shift 34, as shown in FIG. 5, may be stored as the phase compensation data.

As described above, a distortion that occurs in the power amplifying circuit 12 and that is stored in the first amplitude-compensation-data memory 7 and the second phase-compensating memory 3 is offset by a storage distortion component that is adverse thereto.

Hereinbelow, a description will be made regarding operation of the route for performing switching-control of the first and second multiplexers 6 and 8.

Envelope signal $S_{31}$ of the power amplifying circuit 12, for which distortion compensation must be performed, detected by the second envelope detection circuit 18 ($DET_2$) is converted by the $ADC_2$ 19 to a digital signal $S_{32}$. Subsequently, the first arithmetic-operation section 20 ($OP_1$) performs the arithmetic operation of multiplying the linear gain gv of the power amplifying circuit 12 by (1/gv). As a result of the arithmetic-operation, an output signal $S_{33}$ is created.

Similar to the above-described case, the signal $S_{22}$ on the front-stage input side of the power amplifying circuit 12 is detected by the third envelope detection section 16 ($DET_3$). Then, an envelope signal $S_{23}$ is digitized by the third $ADC_3$ 17, and a signal $S_{24}$ is output to the second arithmetic-operation section 21 ($OP_2$).

The second arithmetic-operation section 21 performs the arithmetic operation of the expression (4) by using a signal $S_{33}$ (Vi(t) in the expression (4)), which is the result of the arithmetic operation performed by the first arithmetic-operation section 20, and a digital signal $S_{24}$ (Vpd(t) in the expression (4)). The second arithmetic-operation section 21 ($OP_2$) feeds the result of the arithmetic-operation as the data $S_{36}$ to the second multiplexer 8. In addition, the second arithmetic-operation section 21 feeds a strobe signal $S_{34}$ representing the operation completion to one of the input terminals of the AND-gate circuit 22.

The strobe signal $S_{34}$ takes the logical sum of the half cycle from the fall stage of the clock signal $CLK_2$ created by ½-dividing the reference clock signal $CLK_1$ output from the clock circuit 23. Thereby, a switching signal $S_{35}$ is fed from the AND-gate circuit 22 to the respective control terminals $TC_3$ and $TC_4$ of the first and second multiplexers 6 and 8.

According to the above, the state of each of the first and second multiplexer 6 and 8 is switched from the first read state to the second write state.

Therefore, as an address to be added into the first amplitude-compensation-data memory 7, the arithmetic-operation signal $S_{33}$ is fed thereto from the first arithmetic-operation section 20, the first amplitude-compensation-data memory 7 becomes in a write state, and the arithmetic-operation data $S_{36}$ is written to the first amplitude-compensation-data memory 7 from the second arithmetic-operation section 21 via the second multiplexer 8.

As shown in FIG. 3(G), at the rising stage of the switching signal $S_{35}$ from the AND-gate circuit 22, each of the first and second multiplexers 6 and 8 is switched to the second write state. In this case, as an address, the arithmetic-operation signal $S_{33}$ is fed from the first arithmetic-operation section 20 to the first multiplexer 6; and as write data, the arithmetic-operation data $S_{36}$ is written from the second arithmetic-operation section 21 to the second multiplexer 8. FIGS. 3(F) and FIG. 5(H) show that each of the read signal MR and the write signal MW becomes active at a low level.

Specifically, when the switching signal $S_{35}$ becomes active (high), the read signal MR becomes inactive (high), as shown in FIG. 3(F); in contrast, however, the write signal MW becomes active (low), as shown in FIG. 3(H). A dotted line in FIG. 3(G) indicates a portion where a flag FL turns on.

The write signal MW takes the logical sum of the ½-divided clock signal $CKL_2$ and the half cycle from the rising stage of the reference clock signal $CLK_1$. Therefore, the write signal MW rises at an intermediate time in the switching signal $S_{35}$, and momentarily, the write data $S_{36}$ is written to the first amplitude-compensation-data memory 7, as shown in FIG. 3(J). FIG. 3(I) shows the write-address signal $S_{33}$. At the subsequent rising of the ½-divided clock signal $CLK_2$, the switching signal $S_{35}$ is reset, and an ordinary read operation for the first amplitude-compensation-data memory 7 is restarted.

Hereinbelow, referring to FIG. 4, a description will be made regarding a course in which the amplitude compensation data to be stored in the first amplitude-compensation-data memory 7 according to the above-described operation is modified adaptive to variations in characteristics of the power amplifying circuit 12 according to variations in temperature and the like. In an ordinary power amplifying circuit 12, as shown in FIG. 4, although an output power is increased according to an increase in an input power, the increase ratio gradually decreases. That is, gain suppression occurs, and the characteristics thereof cause distortions.

In an amplitude characteristic curve 31 shown by a solid line in FIG. 4, when the input power indicates a value $A_2$ in FIG. 4, the output power has a value $B_2$. However, if the amplitude characteristics of the power amplifying circuit 12 show an ideal linear gain having straight linearity, the output power thereof is supposed to have a value $B_1$. Therefore, if an input power $A_1$ is used instead of the input power $A_2$ that has no distortion in a state before the distortion occurs in the power amplifying circuit 12, the value of the output power in that case is $B_1$. That is, since predistortion is added to an input voltage, no amplitude distortion occurs in the output power.

In the above, attention is solicited to be paid to the fact that the addition of the predistortion means that an input signal $A_2$ originally having no distortion is converted to an input signal $A_1$ having distortion to thereby add distortion to the input signal $A_2$. The added distortion is offset by distortion occurring in the power amplifying circuit 12; and as a result, the distortion is considered to be improved. Thus, the distortion can be called adverse distortion with respect to distortion occurring in the power amplifying circuit 12.

Taking the above into account, it is assumed that data prestored in the first amplitude-compensation-data memory 7 is amplitude compensation data for an amplitude characteristic curve 33 shown by a single dotted line in FIG. 4.

As shown by the solid line in FIG. 4, when the amplitude characteristic curve 31 varies depending on the ambient environment and the like of the power amplifying circuit 12, the amplitude compensation data prestored in the first amplitude-compensation-data memory 7, which is shown by the amplitude characteristic curve 33, is not valid, and is insufficient for use in amplitude compensation. In the present example mode, operations are performed as described below.

When the input signal $S_{22}$ of the power amplifying circuit 12 represents the value $A_1$, an output voltage $S_{30}$ of the power amplifying circuit 12 is obtained as the value $B_1$. When this value is divided by the linear gain gv, the input power $A_1$ can be obtained in FIG. 4. For data for compensating the amplitude of the power amplifying circuit 12, the input powers $A_1$ and $A_2$ are related to each other such that when the signal $S_{22}$ is the input power $A_2$, it is converted into the input power $A_1$. Therefore, the arithmetic operation of the expression (4) are performed, and the result is restored in the first amplitude-compensation-data memory 7 as data suitable for the aforementioned conversion.

Generally, envelope voltages of the RF input signal $S_1$ are irregularly generated, but they are generated at a constant rate. Therefore, the required voltages are all generated in a certain period, and the contents of the first amplitude-compensation-data memory 7 are all rewritten. Environmental variations, such as a temperature variation, progress very slowly. Compared to the speed of the variations, the time requited for the generation of all the voltages is sufficiently short. That is, the temperature variations and the like can be sufficiently followed. In addition, as described above, during the time when data is read out of the first amplitude-compensation-data memory 7, new data is written. Therefore, even while timing of reading of the compensation data is changed, compensation is performed adaptive to the slow temperature variations.

Figure 2:
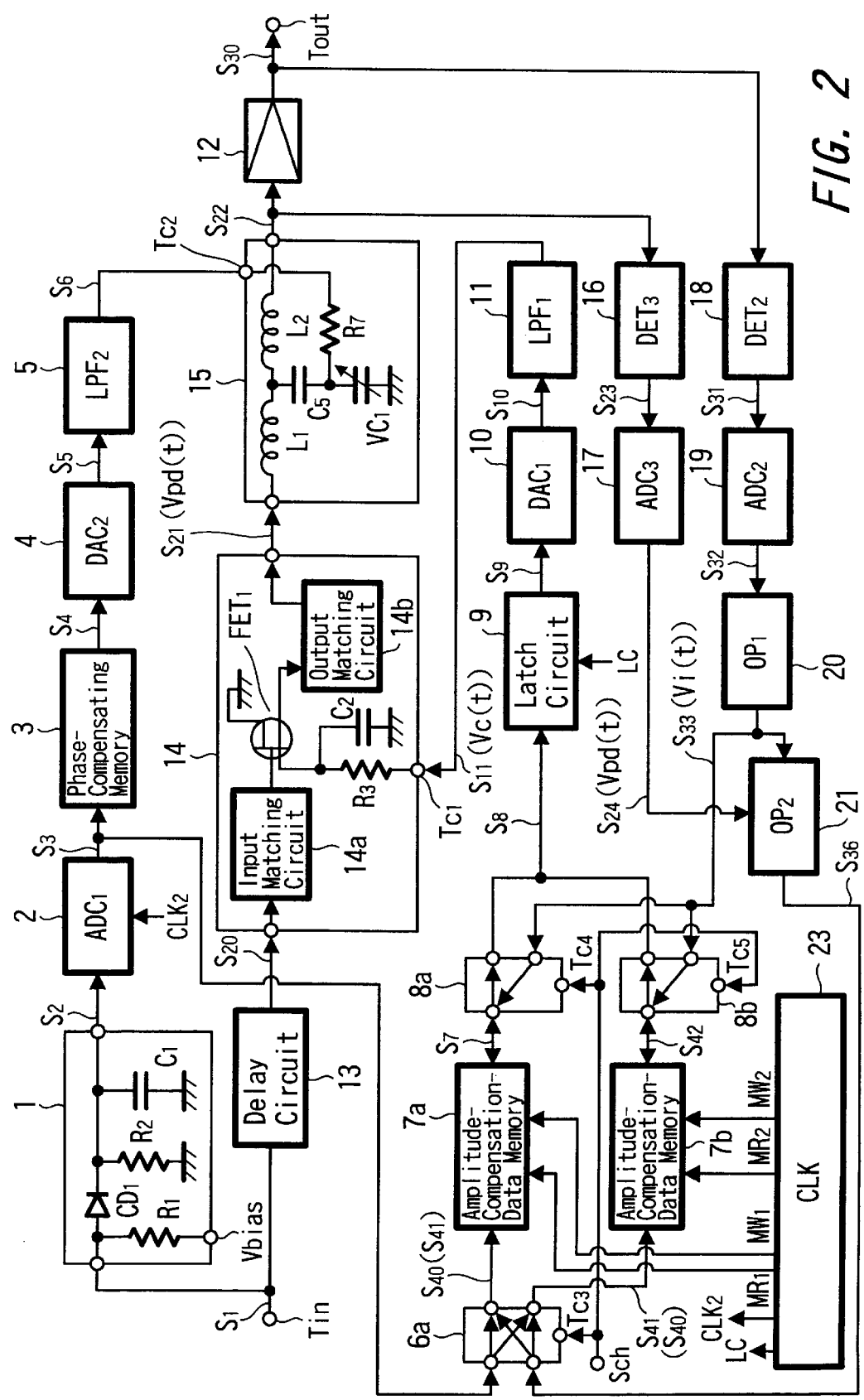
FIG. 2 is a block diagram showing another example mode of the distortion-compensating apparatus according to the present invention.

FIG. 2 is a block diagram showing another example mode of the present invention. FIG. 2 shows a configuration built such that, in FIG. 1, two first amplitude-compensating memories 7 for storing amplitude compensation data are provided, and they are used by switching according to a control signal sch. Hereinbelow, only portions different from FIG. 1 are described, and portions corresponding to those therein are shown with the same reference symbols.

The configuration shown in FIG. 2 has a first multiplexer 6a that switches between a first state and a second state according to the control signal sch. In the first state, a digital signal $S_3$ output from an $ADC_1$ 2 is input as a first input to one terminal thereof, and arithmetic-operation data $S_36$ output from a second arithmetic-operation section 21 is input as a second input to the other input terminal. The first input is output as an output signal $S_{40}$, and the second input is output as an output signal $S_{41}$. In the second state, the first input is output as the output signal $S_{41}$, and the second input is output as the output signal $S_{40}$.

The configuration has a first amplitude-compensation-data memory 7a, a second multiplexer 8a, a latch circuit 9, a first $DAC_1$ 10, and an amplitude control route. The first amplitude-compensation-data memory 7a receives the output signal $S_{40}$ of the first multiplexer 6a as an address, and thereby outputs amplitude compensation data $S_7$ that is prestored to be used for amplitude compensation and that corresponds to the aforementioned address. The second multiplexer 8a has a first state and a second state. In the first state, the second multiplexer 8a receives the amplitude compensation data $S_7$ as a first input, and outputs a signal $S_8$. In the second state, the second multiplexer 8a receives an address signal $S_{33}$ as the amplitude compensation data $S_7$, and writes arithmetic-operation data $S_36$ to the first amplitude-compensation-data memory 7a. The latch circuit 9 latches the signal $S_8$ in synchronization with a latch signal LC. The first $DAC_1$ 10 converts an output $S_9$ into an analog signal $S_{10}$. The amplitude control route removes digital noise from the analog signal $S_{10}$, and feeds an analog control signal $S_{11}$ to a control terminal $Tc_1$ of a first low-bandpass filter circuit 11.

In addition, in a first arithmetic-operation section 20, a first arithmetic operation of multiplying the digital signal $S_{32}$, which is obtained from an envelope signal $S_{31}$ of an output $S_{30}$ of a power amplifying circuit 12 for which distortion compensation must be performed, by (1/gv). The signal $S_{33}$ obtained as a result of the first arithmetic operation is input to second and third multiplexers 8a and 8b. Concurrently, arithmetic-operation data obtained in the first arithmetic-operation section 20 is fed to a second arithmetic-operation section 21, and the data $S_{36}$ is used as the second input. The data $S_{36}$ has been output through an arithmetic operation performed using a digital signal $S_{24}$ that is obtained through digitization of an envelope detection signal in a front stage of the power amplifying circuit 12, which will be described below. The present example mode is configured as described above.

A third envelope detection circuit 16 detects an envelope signal $S_{23}$ of the signal $S_{22}$ fed to the front stage of the power amplifying circuit 12. A third $ADC_3$ 17 digitizes the envelope signal $S_{23}$, and outputs a digital signal $S_{24}$. The digital signal $S_{24}$ is fed to the second arithmetic-operation section 21 from the third envelope detection circuit 16 and the third $ADC_3$ 17.

A third amplitude-compensation-data memory 7b receives the output signal $S_{41}$ of the aforementioned first multiplexer 6a as an input, and outputs data $S_{42}$ to the third multiplexer 8b.

The third multiplexer 8b has a first state and a second state. In the first state, the third multiplexer 8b receives the data $S_{42}$ as a first input, and feeds a signal $S_8$ to the latch circuit 9. In the second state, the third multiplexer 8b feeds the arithmetic-operation signal $S_{33}$ as an address, which has been output from the first arithmetic-operation section 20, to the third amplitude-compensation-data memory 7b as the signal $S_{42}$. Concurrently, the third multiplexer 8b writes thereto the arithmetic-operation data $S_{36}$ output from an arithmetic section 27.

Thus, in the first state, the first amplitude-compensation-data memory 7a is in a read state, and the third amplitude-compensation-data memory 7b is in a write state. In the second state, the third amplitude-compensation-data memory 7b is in a read state, and the first amplitude-compensation-data memory 7a is in a write state. For switching therebetween, the control signal sch is used.

Read signals $MR_1$ and $MR_2$ are fed to the first and third amplitude-compensation-data memories 7a and 7b, respectively. Concurrently, write signals $MW_1$ and $MW_2$ are fed thereto, respectively.

Hereinbelow, operation of the above-described circuit configuration will be described.

First, the first and third amplitude-compensation-data memories 7a and 7b and the second multiplexer 8a are each in the first state. At this time, the first amplitude-compensation-data memory 7a is controlled to the read state shown in FIG. 1; and operations similar to those described referring to FIG. 1 are performed, and compensation operation is thereby performed to compensate for amplitude distortion in the power amplifying circuit 12.

On the other hand, the third amplitude-compensation-data memory 7b is in the write state, in which the arithmetic-operation result $S_{33}$ is applied as an address from the first arithmetic-operation section 20 through the third multiplexer 8b, and the arithmetic-operation result $S_{36}$ is written as data from the second arithmetic-operation section 21 the first multiplexer 6a. In a period where no variation occurs in the control signal sch, these operations are repeated, and data in the first amplitude-compensation-data memory 7a is continuously used in compensation of amplitude distortion in the power amplifying circuit 12.

Suppose the configuration is built such that the data stored in the first amplitude-compensation-data memory 7a is used for compensation of characteristics represented by the amplitude characteristic curve 33 shown by the single dotted line in FIG. 4. In this configuration, according to a temperature variation and the like, when the characteristics of the power amplifying circuit 12 are varied in a state represented by the amplitude characteristic curve 31 shown by the solid line in FIG. 4, as shown in the example mode in FIG. 1, the data to be written to the third amplitude-compensation-data memory 7b can be used for compensation of the characteristics represented by the amplitude characteristic curve 31 shown by the solid line.

Specifically, unless the control signal sch is varied by an external operation, new data is continuously stored in the third amplitude-compensation-data memory 7b. When the control signal sch varies, the first multiplexer 6a is controlled to the second state, and addresses to be added to the first and third amplitude-compensation-data memories are exchanged with each other. Concurrently, either the second multiplexers 8a or 8b is also controlled to the second state, the first amplitude-compensation-data memory 7a is controlled to the write state, and the third amplitude-compensation-data memory 7b is controlled to the read state. Therefore, instead of data in the first amplitude-compensation-data memory 7a, data in the third amplitude-compensation-data memory 7b is used for amplitude compensation of the power amplifying circuit 12, data in the third amplitude-compensation-data memory 7b is thereby updated, and the updated data is used for compensation of the characteristics represented by the amplitude characteristic curve 31 shown by the solid line in FIG. 4.

As described above, in the present example mode, new compensation data is stored in the one of the memories, and the other memory is used for distortion compensation of the power amplifying circuit in a predetermined period. Thus, distortion compensation adaptive to a temperature variation can be performed with the two memories being switched with appropriate timing.

Figure 6:
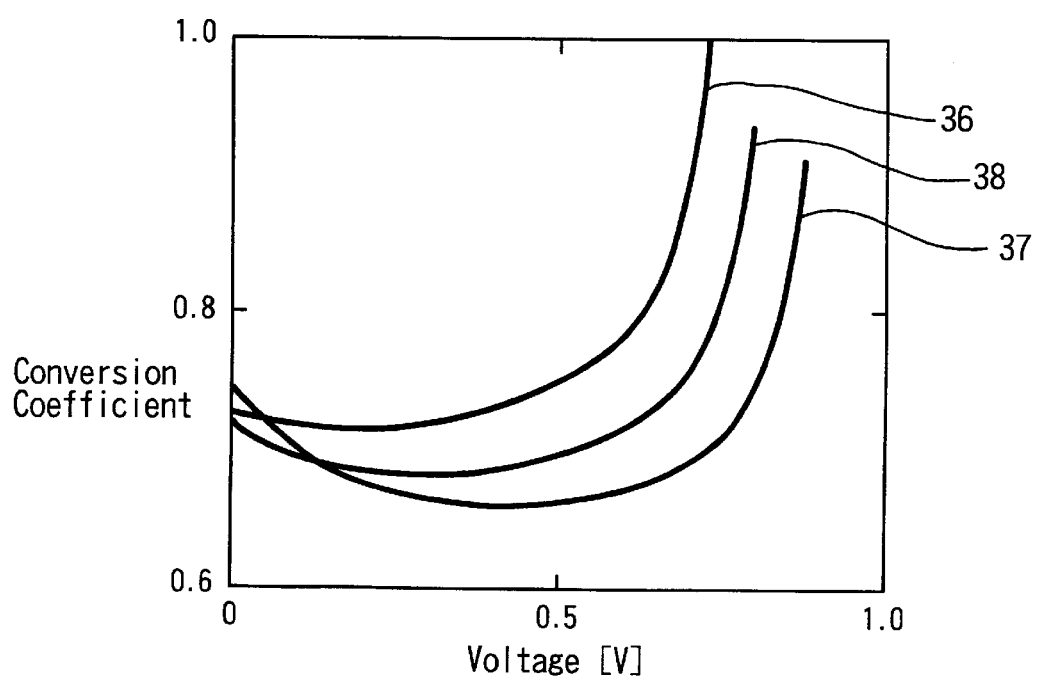
FIG. 6 illustrates characteristic data showing adaptive compensation data in a memory used in the distortion-compensating apparatus of the present invention.
Figure 7:
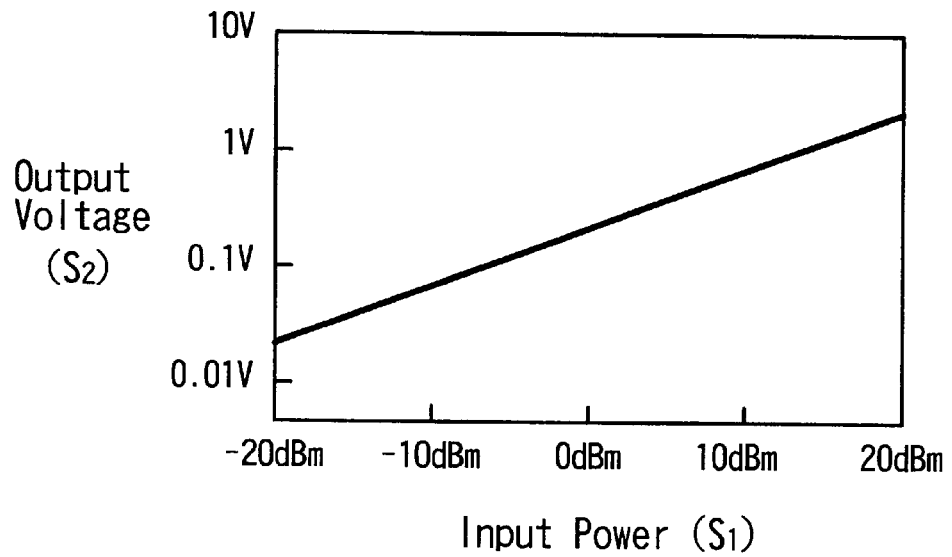
FIG. 7 is a detection characteristic diagram of an envelope detection circuit used in the distortion-compensating apparatus of the present invention.

FIG. 6 shows example compensation table data that is stored in an amplitude-compensation-data memory 7 and that is created according to the characteristics shown in FIG. 7 as an example mode.

FIG. 6 shows the example data in a case where the vertical axis represents conversion coefficients, the horizontal axis represents a voltage (v), and parameters represent variations in the ambient temperature. A line curve 38 represents data characteristics at a room temperature (25° C.), a line curve 36 represents data characteristics at (80° C., and a line curve 37 represents data characteristics at (25° C. The same compensation table data can also be obtained in the example mode described with reference to FIG. 2.

Hereinbelow, a description will be made regarding practical circuit examples of individual configuration elements that can be used to carry out the present invention with reference to FIGS. 1, 2, and 7 to 9.

In an embodiment of a circuit that can be used for the first envelope detection circuit 1 and the second and third envelope detection circuits 16 and 18 shown in FIGS. 1 and 2, the anode terminal of a diode $CD_1$ is used as an input, the cathode terminal thereof is used an output, and a resistor $R_2$ and a capacitor $C_1$ are parallel-connected between the cathode terminal and a ground terminal. When an RF input signal $S_1$ is input to an input terminal $T_{in}$, only envelope signals appear at two ends of the capacitor $C_1$. A bias voltage Vbias is applied thereto via a bias resistor $R_1$ to correct nonlinearity of a small signal portion in the diode $D_1$. FIG. 7 shows characteristics of an output voltage with respect to an RF-input-signal voltage applied as the input signal $S_1$ of an envelope voltage that can be obtained in the first envelope detection circuits 1, 16, and 18.

An embodiment of the gain variable circuit 14 in each of the configurations in FIGS. 1 and 2 uses a double-gate FET, and the double-gate $FET_1$ has a ground-source circuit configuration. In this configuration, an input matching circuit 14a is connected to a first gate, an RF input signal $S_1$ is input as a delayed signal $S_{20}$ via a delay circuit 13 and is controlled to pass through the input matching circuit 14a, and is input to a first gate of the double-gate $FET_1$. An output matching circuit 14b is connected to a drain of the double-gate $FET_1$, and a controlled signal $S_{21}$ is output to the phase shift circuit 15. A resistor $R_3$ and a capacitor $C_2$ are connected to a second gate of the double-gate $FET_1$, and a control voltage Vc ($S_{11}$) is applied thereto via a control terminal $Tc_1$. A relative conductance of the double-gate $FET_1$ has characteristics that depend on the control voltage Vc, and the characteristics are used to perform variable control of the gain (amplitude) thereof.

Figure 8:
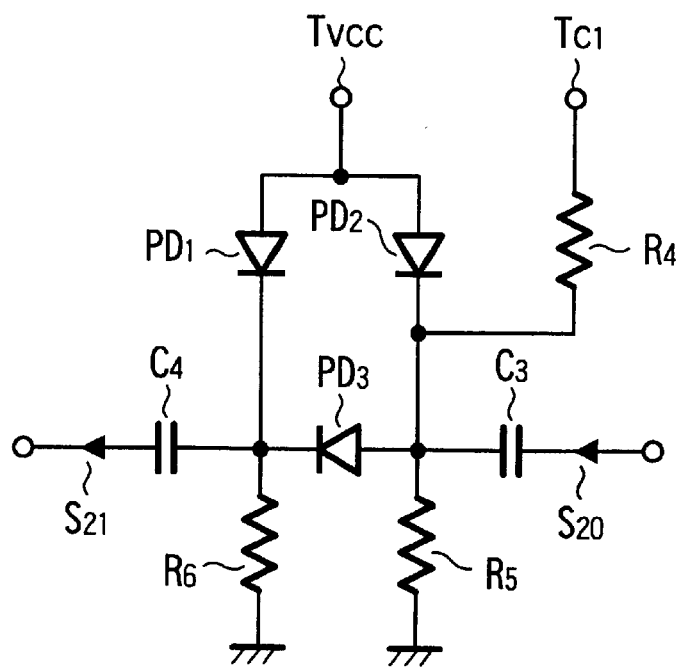
FIG. 8 is another circuit diagram of a gain variable circuit used in the distortion-compensating apparatus of the present invention.

FIG. 8 shows another embodiment of a practical circuit configuration that can be used for the gain variable circuits 14 shown in FIGS. 1 and 2. In the circuit configuration, three PIN diodes $PD_1$, $PD_2$, and $PD_3$ are used, having a configuration of a pie-type attenuation circuit in which a voltage is applied from a terminal Tvcc and is biased through resistors $R_5$ and $R_6$. A control voltage Vc fed to the control terminal $Tc_1$ is applied thereto through a resistor $R_4$. An RF input signal $S_1$ is input thereto as the delayed signal $S_{20}$ from one of terminals of a capacitor $C_3$ through the latch circuit 9, and is output as a signal $S_{21}$. The control voltage Vc is used to control the attenuance of the pie-type attenuation circuit comprised of the three PIN diodes $PD_1$, $PD_2$, and $PD_3$.

In an embodiment of the phase shift circuit 15 shown in one of the FIGS. 1 and 2, a signal $S_{22}$ is output through inductances $L_1$ and $L_2$ that are formed of two series-connected coils. In this case, a circuitry in which a capacitor $C_5$ and a variable-capacitance element $Vc_1$ such as a variable-capacitance diode is series-connected to a connection point of the inductances $L_1$ and $L_2$. The circuitry is connected to a line connected to a ground terminal, and a connection point of the capacitor $C_5$ and the variable-capacitance element $Vc_1$ is connected to the control terminal $Tc_2$ via a resistor $R_7$. According to a voltage of a signal $S_6$ which is applied from the second phase-compensating memory 3 to the control terminal Tc2, the phase of the RF input signal $S_1$ passing between input/output terminals of the phase shift circuit 15 is controlled to shift, and the AM/PM characteristics 35 in FIG. 5 is thereby linearized.

Figure 9:
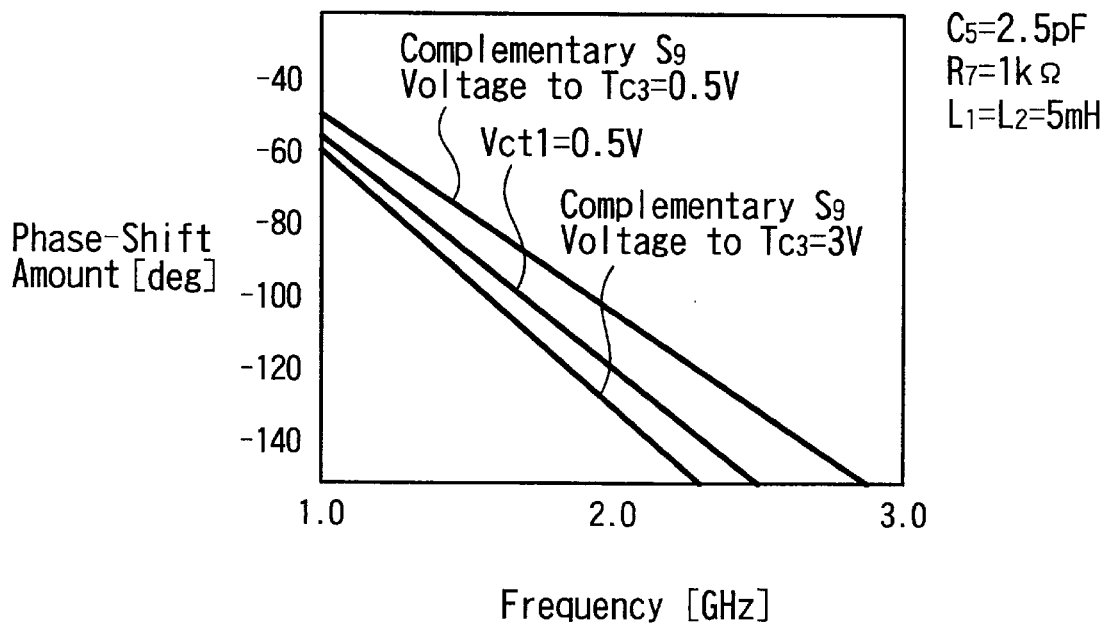
FIG. 9 is a phase characteristic diagram of the phase shift circuit used in the distortion-compensating apparatus of the present invention.
Figure 11:
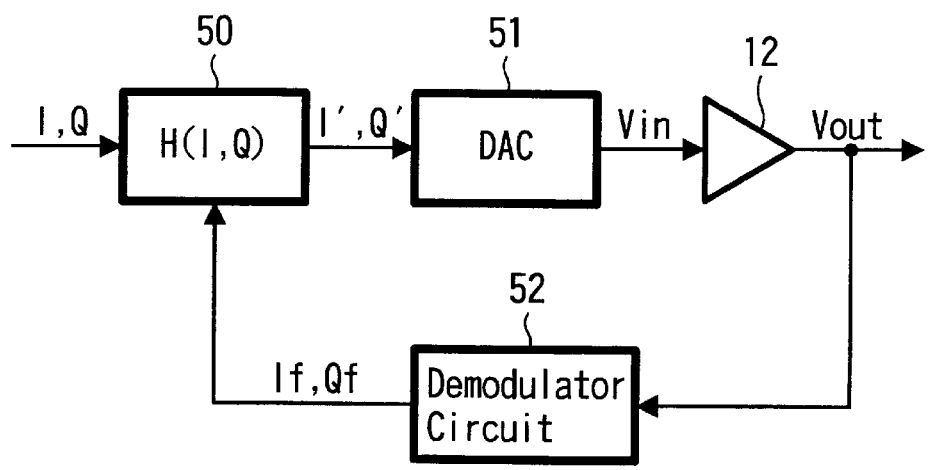
FIG. 11 is a block diagram of a conventional distortion-compensating apparatus.

FIG. 9 shows example characteristics of the phase shift circuit 15. The figure shows practical examples of constants of individual elements when phase-shift characteristics are obtained. Although the constants differ depending on the frequency, shifting in a range of 10 to 40 degrees occurs in a control-voltage range of 0.5 to 3.0 V.

Figure 10:
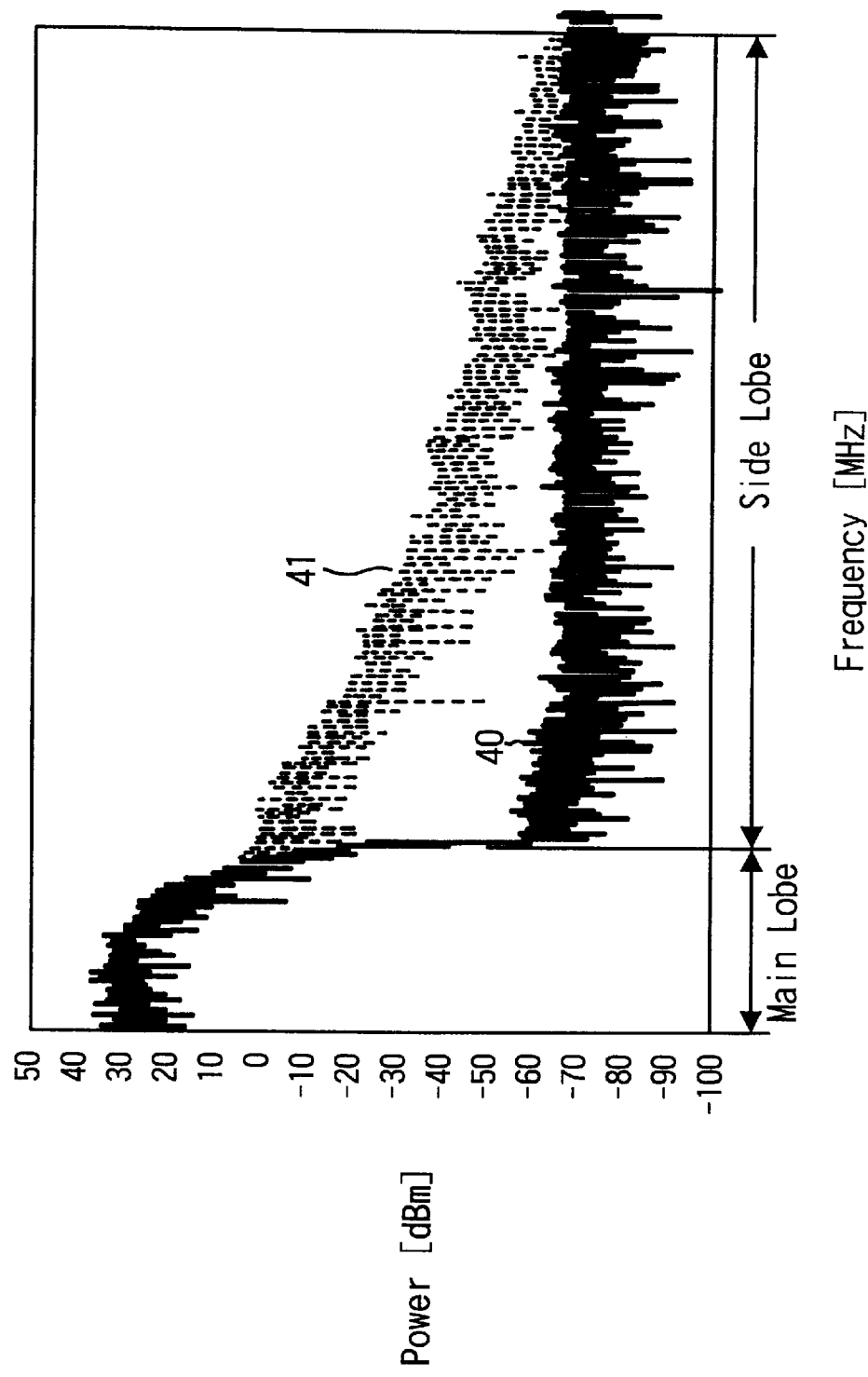
FIG. 10 is a spectrum-characteristic comparison diagram of power amplifying circuits used in a conventional distortion-compensating apparatus and the distortion-compensating apparatus of the present invention.
Figure 12:
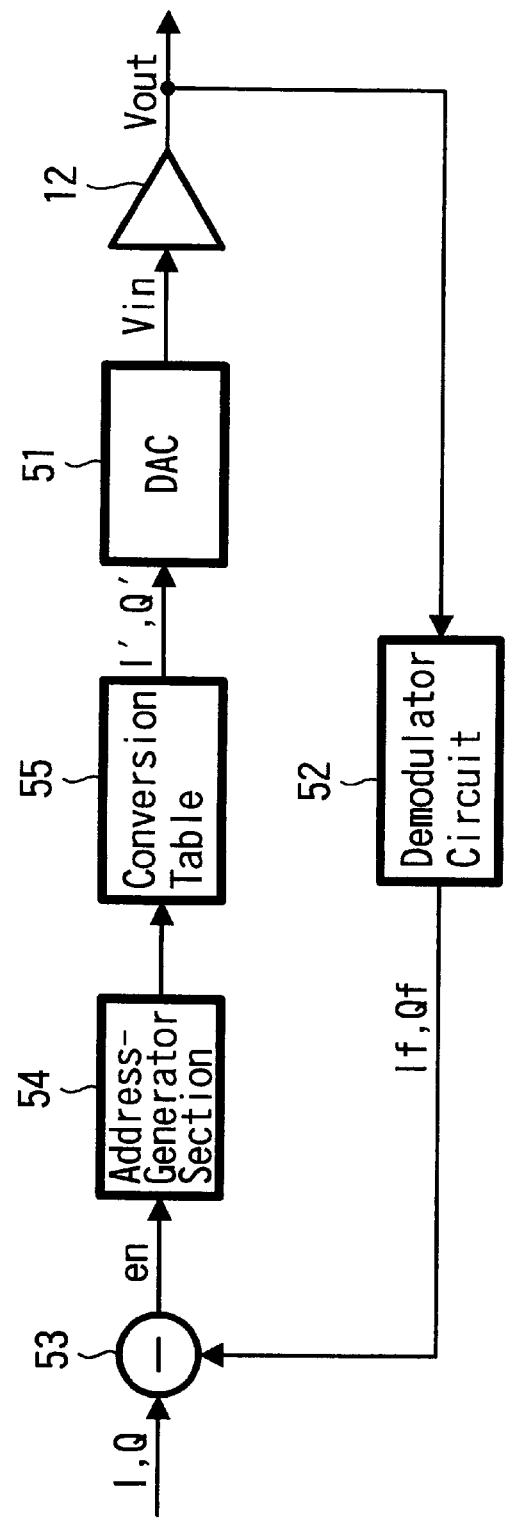
FIG. 12 is a block diagram of another conventional distortion-compensating apparatus.

FIG. 10 shows the behavior of distortion compensation effects according to the distortion-compensating apparatus of the present invention. The type of a signal represented by a line curve 41 is 1S-95 (CDMA-ONE), and the code modulation is 0 QPSK, 1.2288 Mcps. The line curve represents the distortion-generation status when the aforementioned signal is input to the power amplifying circuit 12. A line curve 40 represents the behavior of distortion compensation performed using the embodiment of the present invention under the same condition as described above. As can be seen therefrom, the distortion occurred in the form of a spectrum, the improvement of about 60 dB was achieved, and substantially complete compensation was performed in the frequency band in the vicinity of the side lobe.

According to the present invention, envelope signals on input and output sides of a power amplifying circuit are detected, and a deviation from the linear gain in a power amplifying circuit is thereby arithmetically operated. Specifically, different from the conventional case, the invention does not use a feedback loop and does not repeat distortion compensation adaptive to variations in temperature to reduce the difference. Therefore, the invention can eliminate the problem of not stably converging to optimal values. That is, the invention can solves the problem in the convergence that depends on the repetitious operations, and can provide adaptive distortion compensation by which table values can be updated so that they are stable and are always dependent on the ambient temperature.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A distortion-compensating apparatus for detecting envelope signals of an RF (radio frequency) input signal generating envelope variations to thereby perform predistortion for controlling amplitude characteristics of power amplifying means for which distortion compensation is to be performed, wherein envelope signals at an input side and an output side of said power amplifying means are individually subjected to arithmetic operations, the amount of a deviation from a linear gain is thereby obtained, and distortion-compensating data in storing means which prestores compensation values for amplitude compensation is updated to data obtained from the arithmetic operations so as to be adaptive to temperature variations in said power amplifying means.

2. The distortion-compensating apparatus according to claim 1, characterized by comprising:

a first multiplexer that is provided on a front stage of said storing means, that receives first digital data as an address after detection of the envelope signal of the RF input signal, and that receives second digital data as an address which is obtained through arithmetic operations performed after detection of the envelope signal at the output side of said power amplifying means; and a second multiplexer that performs arithmetic operations of third digital data after the detection of the envelope signal at the input side of said power amplifying means and the second digital data, switches the amount of a deviation from the linear gain to a value obtained through the arithmetic operations, and writes the value to said storing means.

3. The distortion-compensating apparatus according to claim 1, characterized by comprising:

a first multiplexer that is provided on a front stage of said storing means and that can perform switch-feeding of first digital data after detection of the envelope signal of the RF input signal and second digital data obtained through arithmetic operations performed after detection of the envelope signals at the input side and the output side of said power amplifying means to a plurality of storing means; and second and third multiplexers for writing third digital data as the update data which is obtained through arithmetic operations after detection of the envelope signal at the output side of said power amplifying means to said plurality of storing means.

* * * * *